United States Patent [19]

Leabailly et al.

[11] 3,852,798

[45] Dec. 3, 1974

[54] ELECTROLUMINESCENT DEVICE

[75] Inventors: Jacques Leabailly; Jean-Claude Dubois, both of Caen, France

[73] Assignee: U.S. Philips Corporation, New York, N.Y.

[22] Filed: Mar. 12, 1973

[21] Appl. No.: 340,217

[30] Foreign Application Priority Data

Mar. 14, 1972 France .............................. 72.08823

[52] U.S. Cl. ......................... 357/19, 357/17, 357/16

[51] Int. Cl. ............................................ H01l 15/00

[58] Field of Search ................. 317/235 N, 235 AC; 250/211 J

[56] References Cited

UNITED STATES PATENTS

| | | | |
|---|---|---|---|
| 3,537,029 | 10/1970 | Kressel | 331/94.5 |
| 3,560,275 | 2/1971 | Kressel | 148/171 |
| 3,596,136 | 7/1971 | Fischer | 317/234 |
| 3,667,007 | 5/1972 | Kressel | 317/235 R |
| 3,703,671 | 11/1972 | Saul | 317/235 R |
| 3,725,749 | 4/1973 | Grooves | 317/234 R |
| 3,748,480 | 7/1973 | Coleman | 250/211 J |

*Primary Examiner*—Martin H. Edlow

*Attorney, Agent, or Firm*—Frank R. Trifari; Jack Oisher

[57] ABSTRACT

A monolithic semiconductor device having a electroluminescent diode and a photoresistor which controls the current in the diode.

The device comprises in series a diode, a filter layer and a photoconductive layer, the forbidden bandwidth of the filter layer being between that of the diode and of the photoconductive layer.

12 Claims, 6 Drawing Figures

ELECTROLUMINESCENT DEVICE

BACKGROUND OF THE INVENTION

The present invention relates to an electroluminescent device which comprises a monolithic crystalline semiconductor body which is electrically connected in series and comprises at least:

a first contact electrode, a first surface region of a first conductivity type in which the said first electrode is provided on at least a part of the surface of said first region, a second region of a second conductivity type opposite to the first and adjoining the first region and in which the junction between the first and the second region has electroluminescent properties, a photoconductive layer of a semi-insulating material having a forbidden bandwidth which is smaller than the energy of the photons which can be emitted by the said junction, a second contact electrode.

The display devices of which the light element is a diode having an electroluminescent junction have the advantage that they radiate according to Lambert's law and in this manner are visible in the whole space which is defined above the plane in which the emission plane is located. The advantage of an associated large visibility angle would be lost if, in order to improve the contrast and the readibility with a strong ambient illumination, the device would have to be confined to a cavity. The readibility of said displays which are used without such protection depends upon the ambient light and when the latter varies it is desirable to vary the voltage or the supply current of the electroluminescent diode in such manner that a substantially constant contrast is maintained. In the case of a frequently and a rapidly varying ambient light, for example in a vehicle and an airplane, manual control can be avoided by performing a control of the current by means of a photoelectric element which is arranged as near as possible to the display device and which is connected to an electric control system.

The control contrast thus obtained makes the device very complicated and bulky. Even when a single photosensitive element is used for an assembly of electroluminescent elements, the assembly of necessary auxiliary circuits remains complicated.

On the other hand, electroluminescent devices have been proposed the brightness of which can reach very different values, the device fluctuating from one value to the other under the influence of a desired light intensity. Numerous devices of this type have been proposed, for example, as described in French Pat. No. 1,418,687. These devices do not operate proportionally, and it is furthermore not possible, for example, to obtain a display with a constant contrast when the ambient light varies.

SUMMARY OF INVENTION

It is the object of the present invention to provide a simple means which occupies a minimum of space for controlling by ambient light the brightness of a device having an electroluminescent junction. Another object of the invention is to provide a device having a monolithic electroluminescent junction which comprises means to cause the brightness to vary as a function of the radiation received by the device.

Another object of the invention is to provide an electroluminescent device the brightness of which is substantially proportional to the luminous flux which is received.

A compensated semiconductor material will hereinafter be referred to as "semi-insulating" if therein a compensation is caused by certain defects of the crystal lattice or is obtained by a suitable doping by means of impurities having a more or less deep energy level; said compensation causes a resistivity of the material in the order of $10^2$ to $10^8$ ohm.cm. Such materials may occur in one or in the other conductivity type, dependent upon the fact whether the majority charge carriers are electrons or holes.

The invention uses the property of photosensitivity which a region of a semiconductor crystal shows when it is treated with the object of giving it the characteristic features of a semi-insulating material. The conductivity of such a region is increased by absorption of photons, the energy of which is larger than the forbidden bandwidth of the material, and the resultant formation of free electron-hole pairs, and collection of such free charge carriers.

On the other hand the invention uses the property of a semiconductor material of being absorbant to radiation having a wavelength which corresponds to an energy which is larger than the forbidden bandwidth thereof, and of being comparatively transparent to radiation having a wavelength which corresponds to a lower energy than said forbidden bandwidth.

According to the invention, the electroluminescent device comprises a monolithic crystalline semiconductor body and arranged electrically in series:

a first contact electrode, a first surface region of a first conductivity type in which the said first electrode is provided on at least a part of the surface of said region, a second, region of a second conductivity type opposite to the first and adjoining the first region, in which the junction between the said regions has electroluminescent properties, a photoconductive layer of semi-insulating material having a forbidden bandwidth which is lower than the energy of the photons which can be emitted by the said electroluminescent junction, a second contact electrode, and is further characterized in that the photoconductive layer and the said electroluminescent junction are separated optically by an absorbing filter layer of a material having a forbidden bandwidth lying between that of the material of the photoconductive layer and the energy of the photons which can be emitted by said electroluminescent junction, the photoconductive and filter layers being of the second conductivity type.

In the device according to the invention, the photoconductive semiconductor layer is separated optically from the electroluminescent junction. When charge carriers are injected in the device by the contact electrodes, the junction between the first region and the second region becomes electroluminescent, the spectrum of the emitted light being determined especially by the nature and the doping of the material of the said two regions. On the one hand, the light emitted toward the surface of the device leaves the device via the first electrode which, for example, is transparent or porous. On the other hand the light emitted toward the semi-insulating layer is absorbed in the intervening filter layer which is strongly absorbant because of the forbidden bandwidth thereof and said electroluminescent light cannot reach the said semi-insulating layer. On the contrary, radiation originating from ambient illumination outside the device and the wavelength of which corresponds to a smaller energy than the forbidden bandwidth of the material of the absorbant filter layer but which is larger than the forbidden bandwidth of the material of the semi-insulating layer can penetrate the device, traverse the filter layer without appreciable absorption though it stopped the electroluminescent radiation, and reach the semi-insulating layer where it is absorbed and produces a photoconductive effect. A decrease of the resistivity of the photoconductive layer is caused in this manner by all the ambient light having a wavelength which corresponds to a larger energy than the forbidden bandwidth of the material which forms said photoconductive layer and which can reach it and as a result the current intensity through the device can increase and the electroluminescent diode can radiate more strongly.

The photoconductivity of a semi-insulating layer depends upon the number of received and absorbed photons and on the increase of the photoconductivity G, in which $\tau/t$ is determined by the proportion of the life $\tau$ of the photon released carriers relative to the collection time $t$. On the other hand, the curve of the power emitted by an electroluminescent diode as a function of the current which traverses it may usually be assumed to be equal to a straight line throughout the greater part thereof. As a result of this a variation in brightness of the device is obtained which is substantially proportional to the ambient luminous flux received by the photoconductive layer which it contains. The device requires not relays, no auxiliary circuits and demands a minimum space. It is possible to vary the brightness of the device at will, by means of an auxiliary source of radiation without varying the supply voltage. The device is selective, the choice of the materials of the filter and photoconductive layers enabling a selection in the wavelength range of radiation which is used for controlling the photoconductivity. The thickness of the photoconductive layer is determined as a function of the maximum admissible series resistance in the absence of incoming radiation, the surface of the layer and the resistivity of the compensated material being taken into account; said resistivity itself is a function of the compensation factor of the material, as well as the absorption coefficient of said layer which, taking into account the thickness thereof, determines the number of the absorbed photons which can form electron-hole pairs and which increase the conductivity of the layer as a function of the received radiation.

In a preferred embodiment of the invention, the difference in forbidden bandwidth between the materials constituting the filter layer and the photoconductive layer or between the materials constituting the filter layer and the regions of the electroluminescent diode is caused by concentration differences of common components of the materials having different but crystal constants that are near to one another and the same crystal system, as a result of which the crystal lattices are adapted to each other. Gallium and aluminum arsenide $Ga_{1-x}A1hd xAs$, in which $0 < x < 0.40$ is an example of said composed materials with which it is possible to perform epitaxial deposits with a forbidden bandwidth which can be adjusted between that of gallium arsenide and of aluminum arsenide due to a control of the aluminum and gallium concentrations.

In this latter case, the first region which is of the p-type and the second region which is of the n-type are of $Ga_{1-x}A1_xAs$, where for example, $0.3 < x < 0.4$, the filter layer is of $Ga_{1-x}A1_xAs$, in which $0 < x < 0.3$, and the photoconductive layer is of compensated Ga As.

In certain cases it is possible for the manufacture of a monolithic device having two materials of different forbidden bandwidths and poorly compatible crystal lattices, to perform the epitaxial deposits from one material to the other with the interposition of an intermediate layer, a so-called buffer layer, the composition of which varies gradually between those of the materials. The width of the forbidden band varies gradually with the composition and said buffer layer preferably comprises at least partly the filter layer which is to be provided between the photoconductive semi-insulating layer of a first material and the second region of the electroluminescent diode which is made of a second material.

The buffer layer preferably comprises the filter layer and at least a part of the photoconductive layer, the latter being present on a forbidden bandwidth level which is smaller than that of the filter layer.

The device preferably consists of a first region and a second region, which regions are made from gallium arsenide phosphide $GaAs_{1-x}p_x$, where $0 < x < 0.4$, the filter layer is of gallium arsenide phosphide, in which the phosphide concentration decreases from $x$ to 0 in the thickness of the layer in the direction remote from the electroluminescent junction, and the semi-insulating layer is made from compensated gallium arsenide.

Another useful material is gallium-indium phosphide $Ga_xIn_{1-x}p$. The first and second regions are made of this compound, in which $x = 0.25$. The filter layer and the photoconductive compensated layer are present in the buffer layer where the gallium concentration varies from that which corresponds to $x = 0.25$ to that which corresponds to $x = 0$.

When the material of the first and second regions is a semiconductor material having a direct band structure, from which the photon emissions are caused by direct recombination between the conductivity band and valence band, the absorption of the material for the emitted light is considerable. It is known, for example, that it is possible to obtain an absortpion in a radiation-opaque n-region adjoining an electroluminescent pn-junction which can radiate then only via the region of the p-type. In this case the junction is manufactured from a material having a direct band structure by doping the two regions to a sufficient extent. In a particular embodiment, the device according to the invention comprises a p-n junction in a strongly doped material having a direct band structure, in which the surface region is the p-region and the n-region is sufficiently thick to form itself the filter layer absorbing the emitted radiation.

For example, the device in its entirety is manufactured from gallium arsenide and comprises a surface region, an underlying region of the opposite conductivity type, the said two regions being strongly doped, a compensated thin layer and a substrate having a small resistivity, the energy of the photons emitted by the junction being slightly higher than the forbidden bandwidth of gallium arsenide. The underlying region is strongly absorbant for said photons. The thin compensated layer is reached by the part of the radiation incident from without and having a wavelength which is larger than the emitted photons.

The thickness of the absorbing filter layer is determined by the absorption coefficient $\alpha$ of said layer for the radiation emitted by the junction or the part of the radiation which remains after traversing the regions of the diode. The thickness of the absorbing layer is preferably at least equal to three times the absorption distance $1/\alpha$, which corresponds to an attenuation of the incident intensity in the proportion $1/e$.

The structure of the device according to the invention may show various aspects. In a first embodiment which corresponds to a so-called transversal structure, the two electrodes are present on oppositely located surfaces. In this cases the luminescent emission face is also the face through which the ambient radiation is incident and which influences the photoconductive layer. In a first case said radiation must pass through the first surface region, the second region and the absorbing filter layer so as to reach the photoconductive layer; in this case the layers are parallel and situated one above the other, the thicknesses of the surface region and of the second region being minimum. In a second case the surface of the first surface region is restricted and beyond said region the ambient radiation influencing the photoconductive layer need only traverse the second region and the absorbing layer so as to reach the photoconductive layer.

This embodiment is preferably obtained by epitaxy and diffusion and/or ion implantation; the various regions and layers are parallel and present one above the other. The junction preferably is a locally diffused junction the surface of which is noticeably smaller than the surface of the photoconductive layer, for example, smaller by at leat one order of magnitude.

The assembly of the above-stated regions and layers often cannot form an assembly which ensures a sufficient mechanical rigidity of the device. In that case a substrate is necessary and the device comprises: a first surface region, a second region of the opposite conductivity type and an absorbing filter layer, a photoconductive semi-insulating layer and a substrate having a low resistivity and of sufficient thickness, and of the same conductivity type as the semi-insulating layer.

The semi-insulating layer is obtained by ion implantation or diffusion in the substrate or by epitaxial deposition on the substrate. The other regions and layers are obtained by epitaxy and possibly by diffusion as regards the surface regions. A contact is then secured to the substrate by means of, for example, a metal deposit on the surface present opposite to the semi-insulating layer, the substrate thus constituting the second electrode of the device.

The first electrode must then transmit the radiation which is emitted by the device and also the radiation which is to excite the photoconductive layer. Said first electrode is either transparent or porous and consists of a metal ring or a grid, which is deposited on the surface of the first region.

The other electrode need not transmit radiation and may be provided either on the semi-insulating layer or the substrate, for example, in the form of a metal deposit provided by vapour deposition.

In the former case a thin layer of strongly doped semiconductor material having the same conductivity type as the semi-insulating layer is so placed between said latter and the metal deposit that a good non-rectifying contact is ensured.

In this embodiment the emissive surface of the device and possibly the junction have a convex shape, for example, spherical, as is known of certain electroluminescent diodes so as to improve the ratio between the quantity of emitted light and the quantity of light formed at the junction by reducing the losses by total reflection at the surface. The incident ambient light penetrates in the device via the curved surface from which the emitted radiation emerges.

In another embodiment which corresponds to a so-called lateral structural, the two electrodes which enable injection of charge carriers in the device are present on the same flat surface of the latter. In this case also the luminescent emissive surface receives the radiation of the ambient light, but the surrounding surface which receives the ambient radiation may comprise a more important region. The various regions and layers are parallel and present one above the other and can be obtained by local epitaxy and diffusions. The surface of the photoconductive layer which is reached by the ambient radiation preferably is at least one order of magnitude larger than the surface of the local electroluminescent junction.

The devices described thus far by way of several embodiments of the device according to the invention may comprise not only a first region which determines a junction but also a mosaic of junctions. For example, a monolithic electroluminescent device according to the invention may comprise several electroluminescent elements which can be energized individually and which can be integrated in a common crystalline support. The semi-insulating photoconductive layer may be common for the various elements. The insulation between the first regions of different elements is obtained, if desired, by means of grooves or slots, possibly filled with an insulating material, for example $SiO_2$, $Si_3N_4$, an epoxy resin or by isolation diffusions which form P-N junctions which are biased in the reverse direction, the first regions being locally diffused regions in a material of opposite conductivity type.

The methods of manufacturing the various variations of the device are derived from the usual methods, especially ion implantation, diffusion, epitaxy, photo-etching. The layer which must be semi-insulating and photoconductive can be obtained by compensation; for example in the case of a substrate of gallium arsenide a photoconductive layer can be obtained by doping with copper, manganese, iron, nickel or cobalt, which enables obtaining resistivities in the order of $10^2$ ohm.cm. to $10^5$ ohm.cm., or by doping by means of chromium or oxygen which enables obtaining resistivities in the order of $10^5$ to $10^8$ ohm.cm. dependent on the choice of the nature and the concentration of the doping material.

The invention is destined for the manufacture of electroluminescent devices the light output of which is controlled by irradiation from without and in particular by the ambient illumination. The invention may advantageously be used for signalling lights or indicator lights of any type, for example alpha-numerical or in XY-matrix, when the ambient illumination varies, for example, in vehicles, especially airplanes.

DESCRIPTION OF DRAWINGS

The invention will be described in greater detail with reference to the accompanying drawings, of which.

DETAILED DESCRIPTION

Figure 1:
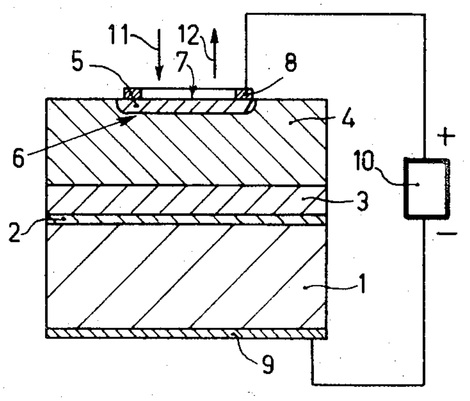
FIG. 1 is a diagrammatic sectional view of a first embodiment of a device according to the invention of the transversal type.

The electroluminescent device in FIG. 1 is manufactured from a semiconductor crystal which serves as a substrate 1. This substrate 1 is of n-type gallium arsenide. Deposited on said substrate 1 is a layer of gallium arsenide 2, 3 a part 2 of which, the photoconductive layer, which has a small thickness, is compensated with copper and a part 3, the filter layer, which is of the n-type, has a small thickness and in addition a certain content of gallium-phosphide, which content increases from the substrate 1 towards the region 4, for example from 0 to 40 percent, then a layer of gallium arsenide phosphide with 40 percent phosphide which is of the n-type and which forms the region 4 in which a region 5 of the p-type is diffused which thus forms an electroluminescent junction 6 with the region 4. On the outer surface 7 of the region 5 a metal electrode 8 is deposited in the form of a ring and a metal layer 9 is deposited on the substrate 1. The electrodes 8 and 9 are connected to a voltage source 10 which serves for applying a forward voltage across the junction 6.

If a radiation 11 is directed toward the device, at least a part of said radiation passes through the layers 4 and 3 and reaches the photoconductive layer 2 and makes same conductive. Due to the polarisation of the device the electrons are collected near the layer 3 and a current traverses the electroluminescent junction, said current depending upon the increase in photoconductivity of the layer 2. When the intensity of the incident radiation 11 varies, the photoconductivity of the layer 2 varies in the same manner and hence also the current through the junction and the brightness of the latter; the intensity of the emitted radiation 12 thus depends upon the illumination at the level of the device.

Figure 2:
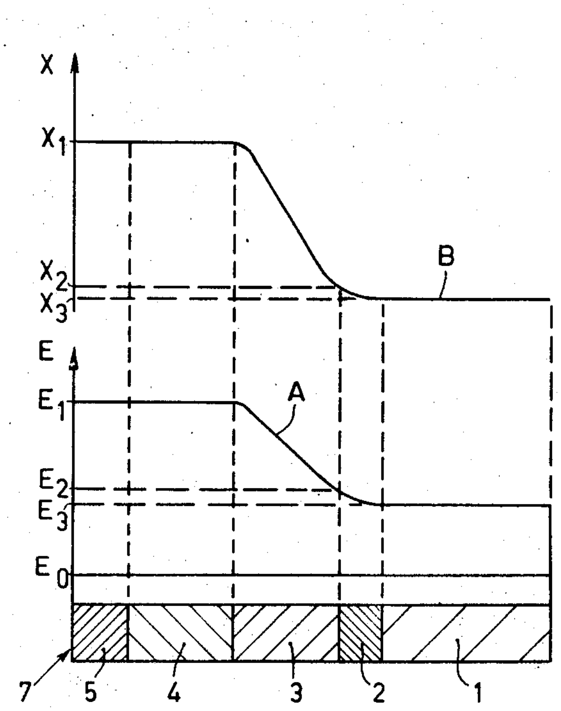
FIG. 2 shows an energy level diagram of an assembly of regions and layers which can form a device according to the invention.

The light 12 emitted by the junction 6 does not influence the photoconductive layer 2. Although, actually, the region 4 is transparent to the emitted radiation, the latter is first absorbed by the filter layer 3 which has a forbidden bandwidth which decreases from the region 4 towards the layer 2. Curve A of FIG. 2 shows a diagram of said forbidden bandwidth as a function of the depth from the surface 7 of the device. In the same figure the content of gallium phosphide $x$ in the compound $GaAs_{1-x}P_x$ are indicated by the curve B, and a cross-section at the bottom enables the recognition of the various layers of the device. This diagram does not take into account the mutual ratios of the thicknesses of the various layers.

In the layers 5 and 4, the content $x$ is equal to $x_1$, and the forbidden bandwidth has a value $E_1$–$E_0$. The content $x$ decreases in the layer 3 from $x_1$ to $x_2$ and in the layer 2 from $x_2$ to $x_3$. The coefficient $x_3$ is equal to 0 in the above-described example; the forbidden bandwidth varies from $E_1$–$E_0$ to $E_2$–$E_0$ < $E_1$–$E_0$ in the layer 3 and from $E_2$–$E_0$ to $E_3$–$E_0$ < $E_2$–$E_0$ in the layer 2.

Figure 3:
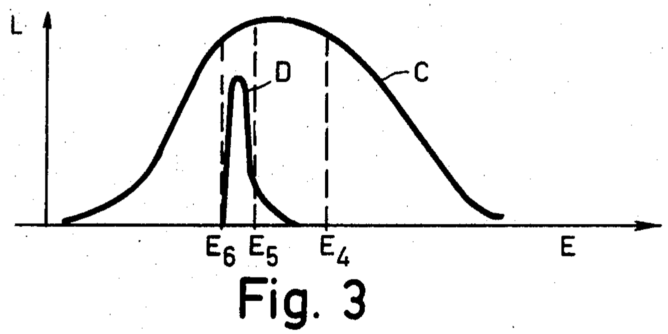
FIG. 3 is a diagram showing the energy spectrum of light received by a device.

The diagram shown in FIG. 3 is an example of a spectrum of white light of the ambient illumination in which curve C demonstrates the number of photons received as a function of the energy of said photons. The photons having an energy higher than $E_4 = E_1$–$E_0$ are absorbed by the layers 4 and 5, the photons having an energy higher than $E_5 = E_2$–$E_0$ are absorbed by the layer 3, the remaining photons having an energy larger than $E_6 = E_3 - E_0$ can be absorbed by the photosensitive layer 2. The curve of the number of photons which is absorbed in said latter layer as a function of the energy of said photons in curve D. The electroluminescent radiation will have an energy peaking around $E_4$, with insignificant energy extending into the spectrum below $E_5$.

Figure 4:
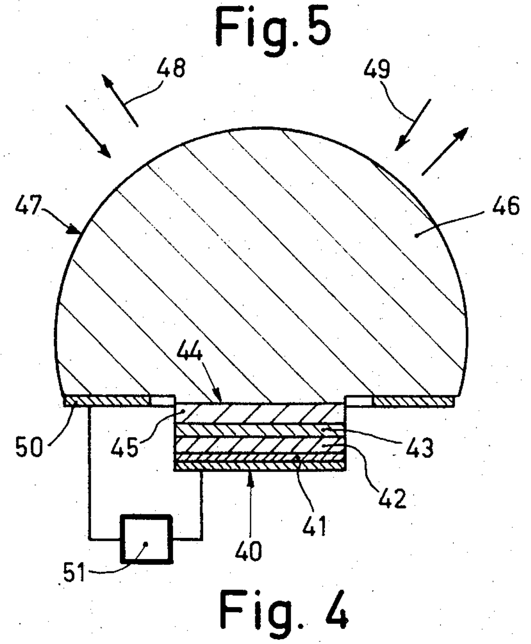
FIG. 4 is a diagrammatic sectional view of a variation of the first embodiment of a device according to the invention.

The device shown in FIG. 4 is an electroluminescent diode the geometry of which is equal to Weierstrass' sphere which enables the losses caused by reflection at the interface between diode and surroundings to be reduced. A junction 44 is present between the regions 45 and 46 which are of opposite conductivity types. The region 43 is the absorbing filter region which protects the photoconductive semi-insulating region 42 from the radiation of the junction 44. The opaque metal electrodes 40 and 50 and the voltage source 51 enable the passage of current in the device. A thin layer 41 which is strongly doped and is of the same conductivity as the layers 45, 43, 42 is placed between the electrode 40 and the layer 42 so as to ensure a good nonrectifying ohmic contact.

The radiation 48 emitted by the junction 44 emenates from the device via the spherical surface 47. The ambient radiation 49 incident from without enters via the same surface.

Figure 5:
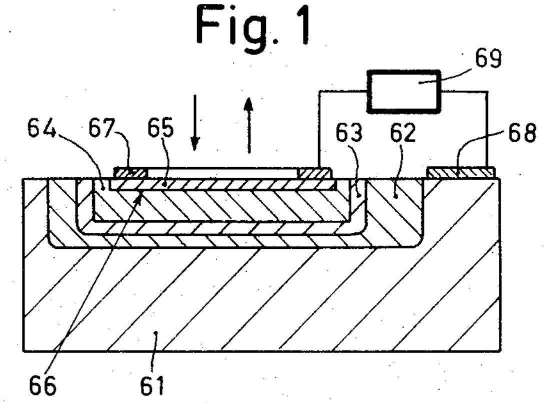
FIG. 5 is a diagrammatic sectional view of a second embodiment of a device according to the invention of the lateral type.

The device shown in FIG. 5 is a so-called lateral structure in which the two electrodes are provided on the same side of the device. The device is manufactured from a plate 61 of a semiconductor material or low resistivity. Deposited or diffused in said plate are the photoconductive region 62 of the same conductivity type as the plate but compensated in such manner that a high resistivity is obtained, the filter region 63 having the same conductivity type but a larger forbidden bandwidth than the material of the region 62, the region 64 having the same conductivity type but a larger forbidden bandwidth than the region 63, and the region 65 of the opposite conductivity type which constitutes an electroluminescent junction 66. Electrodes 67 and 68 and a voltage source 69 enable the supply in series of the above-mentioned regions.

Figure 6:
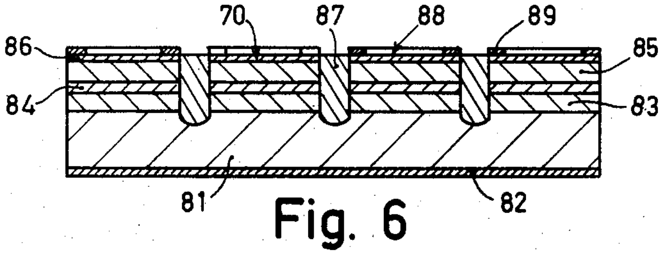
FIG. 6 is a diagrammatic sectional view of an assembly of devices according to the invention.

Several devices according to the invention can be grouped according to various arrangements. The sectional view of FIG. 6 shows electroluminescent diodes having a common electrode which are manufactured from a plate of semiconductor material. The electroluminescent junction 70 between the regions 86 and the regions 85 of the opposite conductivity type are coplanar. The layer parts 84 form protection filter means of the photosensitive layer 83 from radiation of the electroluminescent diodes. A substrate 81 of the same conductivity type as the regions 83, 84 and 85 but having a low resistivity serves as a support. The common electrode 82 and the individual porous electrodes 89 are connected to voltage sources (not shown). The energized diodes emit a localised radiation through their surface 88. The various diodes are insulated from each other by grooves 87 which are filled with an insulating material which reaches at leat the semi-insulating layer 83 and preferably the substrate 81.

The manufacture of a device shown in FIG. 1 can be readily carried out by known methods of manufacturing semiconductor devices. Starting material is, for example, a substrate of monocrystalline gallium arsenide which is doped with llurium with $5.10^{17}$ atoms per $cm^3$ in the form of a disc having a thickness of 150 microns. A layer of gallium arsenide which is compensated with copper having a resistivity of $10^3$ ohm.cm to $10^4$ ohm.cm is deposited on said substrate by vapour phase epitaxy. After depositing a layer of 10 microns thick, the treatment is continued by incorporating in the reactor a compound which can add phosphorus and the addition of said compound is gradually increased, the doping during said last new phase being carried out with selenium or tellurium.

The thickness of the buffer layer thus manufactured is 20 microns and the composition of the deposit at the end of said treatment is $GaAs_{0.61}P_{0.39}$. The deposition is then continued without varying the phosphorus content until a thickness of 10 microns has been obtained.

A local zinc diffusion with an average concentration of $10^{19}$ atoms per $cm^3$ is carried out to a depth of 5 microns to obtain the electroluminescent junction. The electrodes are deposited by vacuum deposition of aluminum on the side of the electroluminescent diode and of tin on the side of the substrate.

It has been found repeatedly that the intensity of the emitted radiation of the devices according to the invention described increases approximately proportionally with the intensity of the ambient light.

What is claimed is:

1. An electroluminescent device comprising:

a. a monolithic crystalline semiconductor body, said body having in electrical series relationship
   i. a first surface region of a first conductivity type,
   ii. a second region of a second conductivity type opposite to said first type and adjoining the first region and forming with the latter a P-N junction having electroluminescent properties and capable of emitting photons within a certain energy range when current is passed through the P-N junction,
   iii. a filter layer of the second conductivity type, and
   iv. a photoconductive semi-insulating layer of the second conductivity type and having a forbidden bandwidth which is smaller than the energy of the photons emitted by the electroluminescent junction, said filter layer having a forbidden bandwidth which lies between that of the photoconductive layer and the energy of the photons emitted by the electroluminescent junction, and b. first and second electrodes connected to the body for passing current through the series connected regions and layers whereby the photon output from the device is controlled by the resistance of the photoconductive layer which in turn is controlled by external illumination.

2. A device as set forth in claim 1, wherein the first electrode is connected to the first region and the econd electrode is connected to the photoconductive layer, the first region and first electrode are substantially transparent to and the filter layer is substantially absorbant of the emitted photons from the electroluminescent junction, and the first electrode, first and second regions and filter layer are substantially transparent to and the photoconductive layer is substantially absorbant of a portion of the spectrum of external ambient illumination.

3. A device as claimed in claim 1, wherein the material constituting the first and second regions and the material constituting the filter layer having different concentrations of common components and crystallise in the same crystal system, and the material constituting the filter layer and the material constituting the photoconductive layer have different concentrations of common components and crystallize in the same crystal system.

4. A device as claimed in claim 3, wherein at least a part of the filter layer is present in a buffer layer in which the concentrations of the said common components vary gradually between the values of said concentration on either side of the buffer layer.

5. A device as claimed in claim 1, wherein the filter layer consists of the same material as that of the second region of the semiconductor body, said material having a direct band structure.

6. A device as claimed in claim 1, wherein the filter has a thickness at least equal to three times the absorption distance $1/\alpha$, where $\alpha$ is the absorption coefficient of the material of said filter layer for the photon energy emitted by the electroluminescent junction.

7. A device as claimed in claim 1, wherein the surface of the photoconductive layer which is reached by the external illumination is at least one order of magnitude larger than the surface of the electroluminescent junction.

8. A device as claimed in claim 2, wehrein the said first region has a convex outer surface through which the photons emitted by the junction emanates and the external illumination enters.

9. A device as claimed in claim 1 and comprising several isolated electroluminescent junctions integrated in a common crystalline support.

10. A device as claimed in claim 1, wherein the first region is p-type and the second region is n-type and the first and second regions are constituted of gallium arsenide phosphide $GaAs_1 {}_{-x}P_x$ where $x$ decreases from the value in the first and second regions to 0, and the photoconductive layer is constituted of gallium arsenide phosphide $GaAs_1 {}_{-x}P_x$, wherein $0 < x < 0.4$, the filter layer is n-type and is constituted of $GaAs_{1-x}P_x$ where $x$ decreases from the value in the first and second regions to 0, and the photoconductive layer is constituted of compensated gallium arsenide GaAs which has a resistivity which lies betwen $10^2$ and $10^8$ ohm-cm.

11. A device as claimed in claim 1, wherein the first region is p-type and the second region is n-type and the first and second regions are constituted of gallium aluminum arsenide $Ga_{1-x}Al_xAs$, where $0.3 < x < 0.4$, the filter layer is n-type and constituted of gallium aluminum arsenide $Ga_{1-x}Al_xAs$, where $0 < x < 0.3$, and the photoconductive layer is constituted of compensated gallium arsenide GaAs having a resistivity between $10^2$ and $10^8$ ohm-cm.

12. A device as claimed in claim 2, wherein the material of the photoconductive layer is compensated gallium arsenide in which the compensation is caused by the addition of an element from the group consisting of copper, iron, nickel, cobalt, manganese, chromium and oxygen.

* * * * *

PO-1050
(5/69)

UNITED STATES PATENT OFFICE
CERTIFICATE OF CORRECTION

Patent No. 3,852,798 Dated December 3, 1974

Inventor(s) JACQUES LEABAILLY ET AL

It is certified that error appears in the above-identified patent and that said Letters Patent are hereby corrected as shown below:

Column 5, line 38, change "leat" to -- least --.

Column 9, line 10, change "leat" to -- least --.

Column 10, line 6, change "econd" to -- second --.

Signed and sealed this 11th day of March 1975.

(SEAL)
Attest:

RUTH C. MASON
Attesting Officer

C. MARSHALL DANN
Commissioner of Patents
and Trademarks